(12) United States Patent
Boskamp et al.

(10) Patent No.: US 7,309,989 B2
(45) Date of Patent: Dec. 18, 2007

(54) WIRELESS RF COIL POWER SUPPLY

(75) Inventors: Eddy B. Boskamp, Menomonee Falls, WI (US); Ronald D. Watkins, Niskayuna, NY (US); Glen P. Koste, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 64 days.

(21) Appl. No.: 10/907,582

(22) Filed: Apr. 6, 2005

(65) Prior Publication Data

US 2006/0226841 A1    Oct. 12, 2006

(51) Int. Cl.
G01V 3/00    (2006.01)
(52) U.S. Cl. ..................................... 324/322
(58) Field of Classification Search ......... 324/300–322
See application file for complete search history.

(56) References Cited

U.S. PATENT DOCUMENTS

| | | | |
|---|---|---|---|
| 4,928,319 A * | 5/1990 | Pitt et al. ................... 398/171 |
| 5,119,679 A * | 6/1992 | Frisch ......................... 73/705 |
| 5,245,288 A | 9/1993 | Leussler |
| 5,294,931 A * | 3/1994 | Meier ........................ 342/44 |
| 5,384,536 A | 1/1995 | Murakami et al. |
| 5,430,447 A * | 7/1995 | Meier ....................... 340/10.51 |
| 5,581,617 A | 12/1996 | Schotz et al. |
| 5,696,449 A | 12/1997 | Boskamp |
| 5,733,247 A * | 3/1998 | Fallon ........................ 600/410 |
| 5,850,181 A * | 12/1998 | Heinrich et al. .......... 340/572.1 |
| 5,889,603 A * | 3/1999 | Roddy et al. ............... 398/168 |
| 6,008,649 A | 12/1999 | Boskamp et al. |
| 6,052,614 A * | 4/2000 | Morris et al. ............... 600/509 |
| 6,218,834 B1 | 4/2001 | Goto |
| 6,232,779 B1 | 5/2001 | Tropp et al. |
| 6,249,121 B1 | 6/2001 | Boskamp et al. |
| 6,369,550 B1 | 4/2002 | Lou et al. |
| 6,429,775 B1 * | 8/2002 | Martinez et al. ......... 340/572.1 |
| 6,542,768 B1 * | 4/2003 | Kuth et al. ................. 600/411 |
| 2001/0051766 A1 | 12/2001 | Gazdzinski |
| 2003/0135110 A1 | 7/2003 | Leussler |
| 2003/0206019 A1 * | 11/2003 | Boskamp .................... 324/322 |

FOREIGN PATENT DOCUMENTS

EP    527530 A1    7/1992

* cited by examiner

*Primary Examiner*—Brij Shrivastav
*Assistant Examiner*—Dixomara Vargas
(74) *Attorney, Agent, or Firm*—Ziolkowski Patent Solutions Group, SC

(57) ABSTRACT

A system wirelessly supplies electrical power to an RF coil and an analog-to-digital converter (ADC) for an MRI system. The system supplies power to at least operate the RF coil and ADC without the use of a battery and without use of a wired connection external to the bore of the magnet.

28 Claims, 4 Drawing Sheets

WIRELESS RF COIL POWER SUPPLY

BACKGROUND OF THE INVENTION

The present invention relates generally to magnetic resonance imaging (MRI) and, more particularly, to a wireless RF coil power supply for an RF module configured to acquire MR signals from a receive coil of an MRI system.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to an RF magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Generally, the RF coil assembly of an MRI system includes a transmit coil to create the B1 field and a receive coil used in conjunction with the transmit coil to detect or receive the signals from the excited spins in an imaged object. Typically, each receive coil of the RF coil assembly is connected to the receive chain of the MRI system via a coaxial transmission line or cable. Additionally, the receive coils of the RF coil assembly are typically supplied power through the coaxial cables. As the number of receive coils increases, the number of coaxial cables increases to match; thus, a large bundle of coaxial cables results that can become uncomfortable for an imaging patient when laid across the patient and difficult to manage or maneuver.

Further, interactions such as parallel resonance and parasitic capacitance between the transmit coil and the coaxial cables can cause standing waves and induced current in the coaxial cables. Current induced in the coaxial cables can cause the coaxial cables to become extremely heated, which furthers patient uncomfortability.

It would therefore be desirable to have a system capable of supplying wireless power to an RF receive coil assembly as well as a system wirelessly connecting the RF receive coil assembly to a receiver of an MR scanner.

BRIEF DESCRIPTION OF THE INVENTION

The present invention is directed to a system and method overcoming the aforementioned problems by providing a wireless power supply arranged to provide power to operate an RF coil assembly. The wireless power supply operates without the use of a battery or a wired connection external to a bore of a magnet assembly of an MRI system. In one embodiment, the present invention incorporates a coil configured to pick up and convert RF signals into electrical energy. In another embodiment, a photovoltaic cell is configured to convert light energy into electrical energy.

Therefore, in accordance with one aspect of the invention, an MR system is disclosed that includes an RF coil operable to transmit or receive RF signals and located within a bore of a magnet, and a converter to convert RF signals to digital signals. The MR system further includes a power supply that provides power to at least operate the RF coil and converter. The power supply is operable without use of a battery and without use of a wired connection external to the bore of the magnet.

In accordance with another aspect of the invention, an MR assembly is disclosed that includes an RF coil operable in at least one of a transmit mode and a receive mode, and configured to be located within a bore of a magnet. A transmitter is operably connected to the RF coil and wirelessly transmits MR signals acquired by the RF coil when operating in a receive mode. The MR assembly also includes a power supply that provides power to at least operate the transmitter and the RF coil. The power supply has at least one photovoltaic cell and a fiber optic cable to receive a beam of light from a light source external to the bore of the magnet and translate the beam of light to the power supply.

In accordance with a further aspect of the present invention, an MR apparatus includes a first RF coil for transmitting an RF signal inside a magnet bore and a second RF coil placed adjacent to an imaging subject positioned inside the magnet bore. The second RF coil operates in a receive mode to receive MR signals from the imaging subject. A signal converter is included to convert MR signals into digital signals. The MR apparatus further includes a rechargeable power supply connected to the second RF coil and the signal converter that supplies power thereto and a pickup coil connected to the rechargeable power supply and to recharge the power supply with electrical energy generated from the RF signal.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

The present invention will be described with respect to a whole body RF coil assembly of an MRI system having a transmit coil to create a B1 field and a receive coil used in conjunction with the transmit coil to detect or receive the signals from excited spins of nuclei in an imaged object. However, one skilled in the art will appreciate that the present invention is also applicable with local and surface coils.

Figure 1:
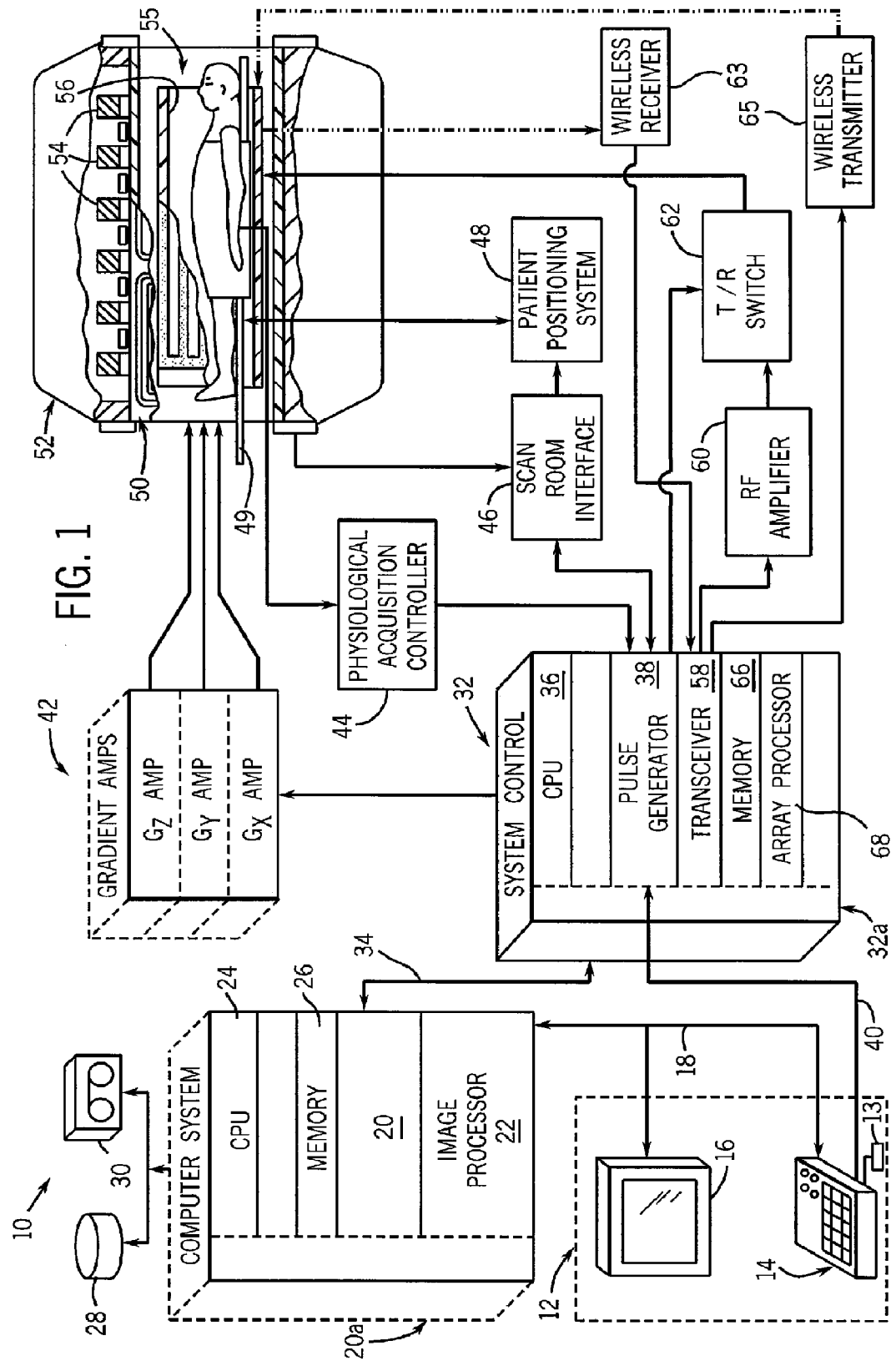
FIG. 1 is a schematic block diagram of an MR imaging system incorporating the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54, a bore 55, and a whole-body RF coil assembly 56. Preferably, assembly 56 includes a transmit coil to create a B1 field and a receive coil used in conjunction with the transmit coil to detect or receive the signals from excited spins of nuclei in the imaged object.

A transceiver module 58 in the system control 32 produces pulses which are amplified by an RF amplifier 60 and coupled to the transmit coil of RF coil assembly 56 by a transmit/receive switch 62. Transceiver module 58 wirelessly transmits phase information to a frequency converter (shown in FIGS. 2-4) inside bore 55 via a wireless transmitter 65. The resulting signals emitted by the excited nuclei in the patient may be sensed by the receive coil of RF coil assembly 56 and wirelessly transmitted to a wireless receiver 63. The received signals are then input into the transceiver module 58. The transmit/receive switch 62 is controlled by a signal from the pulse generator module 38 to electrically connect the RF amplifier 60 to the coil assembly 56 during the transmit mode. The transmit/receive switch 62 can also enable a separate RF coil (for example, a surface coil) to be used in either the transmit or receive mode.

The MR signals picked up by the receive coil of RF coil assembly 56 and transmitted to wireless receiver 63 are transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived, such as on the tape drive 30, or it may be further processed by the image processor 22 and conveyed to the operator console 12 and presented on the display 16.

Figure 2:
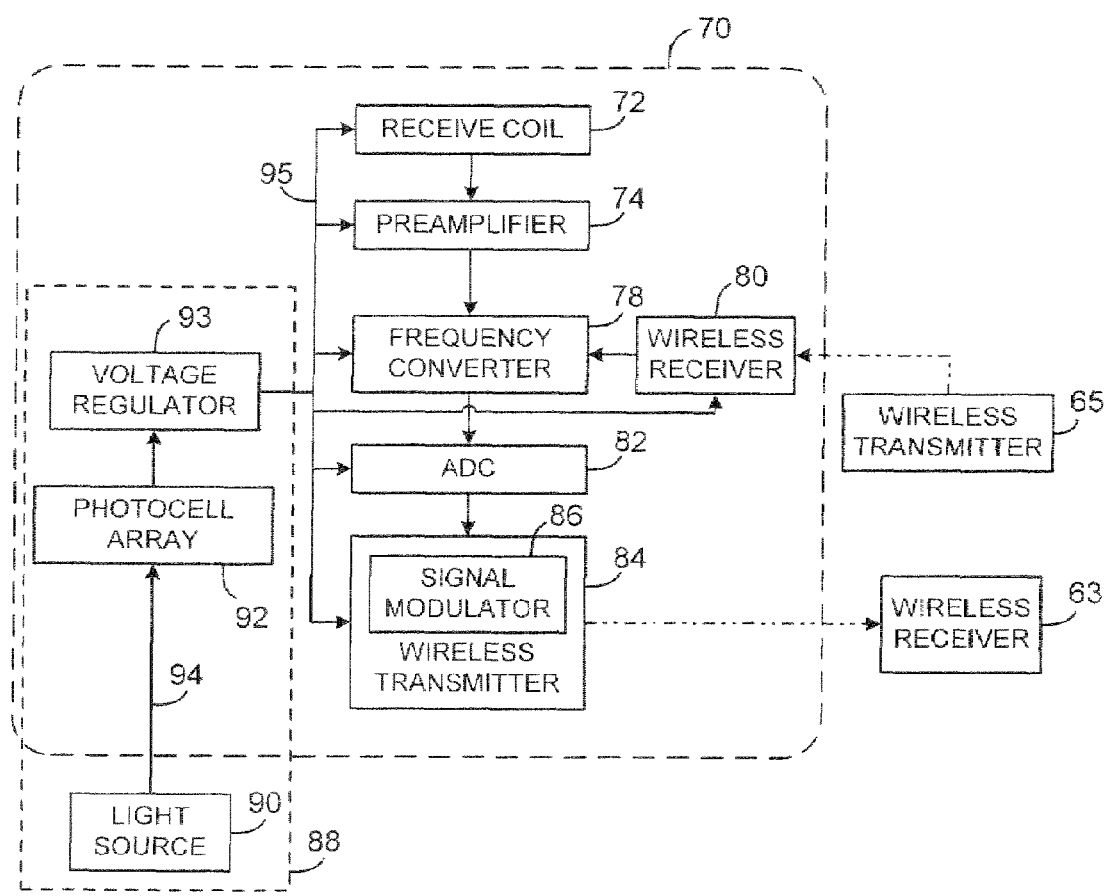
FIG. 2 is a schematic block diagram of an RF module incorporating a wireless power supply having a photocell according to one embodiment of the present invention.

Referring now to FIG. 2, a digital RF module 70 for receiving the signals from excited spins of nuclei in the imaged object and for wirelessly transmitting the signals to wireless receiver 63 for subsequent processing is schematically illustrated. A receive coil 72 detects the signals from the imaged object. A preamplifier 74 amplifies the detected signals received from receive coil 72.

A frequency converter 78 downconverts the signals to reduce the required bandwidth of the ADC used in digitization of the signals from the digital RF module 70 to the wireless receiver 63. Downconversion requires phase information from the transmit pulse carrier. In a preferred embodiment, transceiver module 58 wirelessly transmits the phase information to a wireless receiver 80, which supplies the phase information to the frequency converter 78.

Wireless transmission, as used herein, comprises a transmission medium without electrically conductive wires. In this way, the transmission medium does not contain electrically conductive wires that adversely interact with RF pulses from the transmit coil. The wireless transmission, being free of electrically conductive wires, prevents the RF pulses from the transmit coil from inducing currents on electrically conductive wires placed in the vicinity of an imaging patient. Modes of wirelessly transmitting signals include RF signals transmitted through the air and light signals transmitted between an optical transmitter and receiver pair across fiber optic cables. Other modes of transmitting signals without the use of electrically conductive wires are similarly contemplated and are considered within the scope of the present invention.

Still referring to FIG. 2, the downconverted signals are digitized by an analog-to-digital converter (ADC) 82. The digital signals are then wirelessly transmitted by a wireless transmitter 84 to the wireless receiver 63. The wireless transmitter 84 and the wireless receiver 63 communicate without the use of electrically conductive wires as described above. In a preferred embodiment, a signal modulator 86 converts the electrical signals into either RF pulses for transmitting the signals via RF signals or light signals for transmitting the signals via fiber optic cable.

Power to the components 72-86 of the digital RF module 70 is generated wirelessly and without the use of a battery, which converts chemical energy into electrical energy. In one embodiment and as shown in FIG. 2, a power supply 88 includes a light source 90 optically connected to a photocell array 92 via a fiber optic cable 94. Fiber optic cable 94 has a plurality of fiber strands designed to transfer light from the light source 90 to the photocell array 92. Photocell array 92 includes an array of photovoltaic cells that converts visible light, infrared radiation and/or ultraviolet radiation into direct current (DC). Light source 90 is preferably a high intensity light source optically coupled to the photocell array 92 that supplies visible light, infrared radiation, or ultraviolet radiation to the photocell array 92. Light source 90 can be located inside or outside of the bore 55. A voltage regulator 93 regulates the voltage from the photocell array 92.

A power bus 95 connects power supply 88 to receive coil 72 to provide a voltage reference. Power bus 95 further connects power supply 88 to preamplifier 74, frequency converter 78, wireless receiver 80, ADC 82, wireless transmitter 84, signal modulator 86, and other components in digital RF module 70 that require electrical power. Power supply 88 supplies power to power bus 95 for power distribution thereacross.

Figure 3:
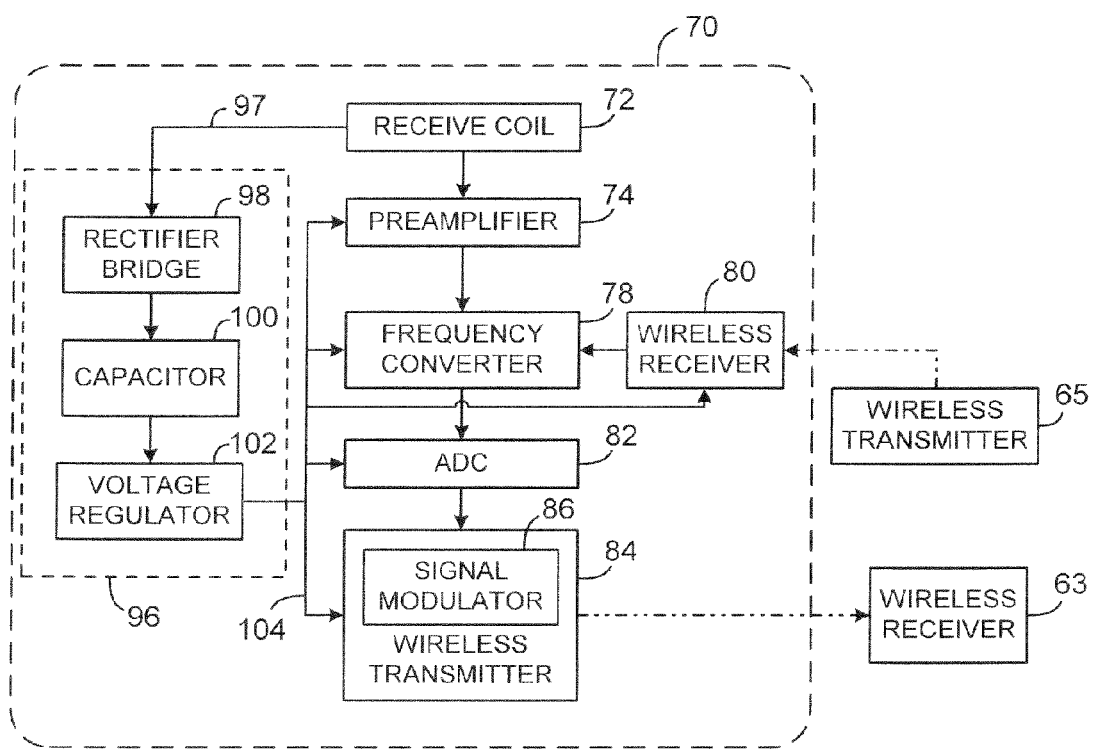
FIG. 3 is a schematic block diagram of an RF module incorporating a wireless power supply having a rectifier bridge and an energy storage device according to another embodiment of the present invention.

FIG. 3 shows a rechargeable power supply to provide power to the digital RF module 70 in accordance with another embodiment of the present invention. A power supply 96 is configured to derive electrical power directly from the receive coil 72 itself. During the transmit mode of the coil assembly transmitter, the receive coil 72 has a voltage induced therein that does not represent image data. As such, the induced voltage caused by the transmit coil of the coil assembly 56 is transmitted to power supply 96 over an electrical connection 97 and is rectified by a rectifier bridge 98 and stored in a capacitor 100 or other energy storage device. In a preferred embodiment, capacitor 100 includes at least one ultracapacitor for storing the rectified voltage. The rectifier bridge 98 includes a plurality of diodes configured to rectify the RF induced voltage. The capacitor 100 receives and stores the rectified voltage. The capacitor 100 is connected to a voltage regulator 102, which controllably discharges and powers the components 74-86 over a power bus 104 during the receive mode of the coil assembly.

Figure 4:
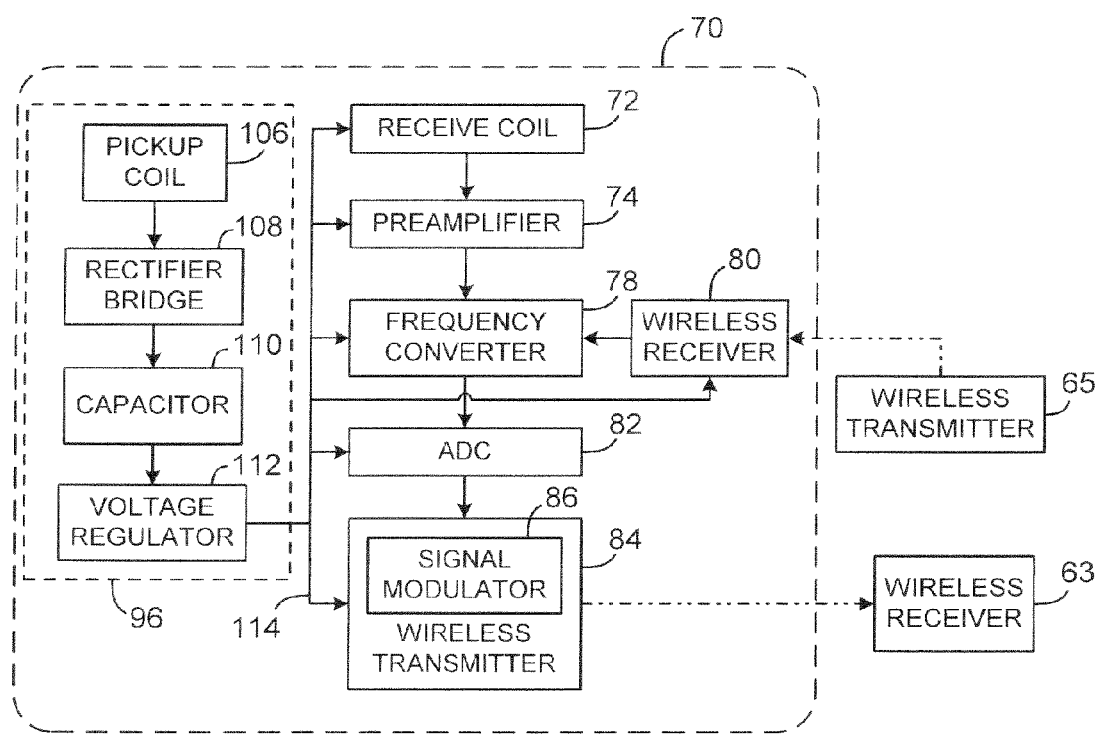
FIG. 4 is a schematic block diagram of an RF module incorporating a wireless power supply having a pickup coil according to yet a further embodiment of the present invention.

It is contemplated that rectifier bridge 98 may draw enough current out of receive coil 72 to cause an imaging artifact. As such, a separate pickup coil 106 can be used as shown in FIG. 4. Pickup coil 106 is located inside digital RF module 70 and away from with the imaging patient. Pickup coil 106 is preferably a multi-turn loop of wire in which an RF voltage is induced by the transmit mode of the coil assembly transmitter. During the transmit mode of the coil assembly transmitter, the pickup coil 106 has a voltage induced therein. As such, the induced voltage caused by the transmit coil of the coil assembly 56 is rectified by a rectifier bridge 108 and stored in a capacitor 110 or other energy storage device. Power from capacitor 110 is regulated by a voltage regulator 112 and is supplied to the components 74-86 over a power bus 114. Power bus 114 also connects power supply 96 to receive coil 72 to provide a voltage reference. Pickup coil 106 is located away from receive coil 72 such that distortion to the uniformity of the transmit field near receive coil 72 is reduced.

In an alternative embodiment, pickup coil 106 is a multi-turn loop of wire in which voltage is induced by gradient fields. In this case, pickup coil 106 is constructed to be sensitive to a low KHz range where the main frequency associated with the leading and trailing edges of the gradient pulses is located. The induced voltage is rectified by rectifier bridge 108, stored in a capacitor 110, and regulated by voltage regulator 112 for supplying power to the components 74-86 over power bus 114.

The present invention is directed to an apparatus whereby a batteryless power system provides power to the components of a digital RF module. The batteryless system avoids the typical wired connections external to the bore of the magnet assembly of conventional MRI systems. As such, patient discomfort typically caused by placing a large bundle of wires across the patient is eliminated. Also, in one preferred embodiment, fiber optic cables are advantageously used to supply power. Moreover, these fiber optic cables advantageously output less heat compared to conventional wire-based power supplies.

Therefore, in accordance with one embodiment of the invention, an MR system is disclosed that includes an RF coil operable to transmit or receive RF signals and located within a bore of a magnet, and a converter to convert RF signals to digital signals. The MR system further includes a power supply that provides power to at least operate the RF coil and converter. The power supply is operable without use of a battery and without use of a wired connection external to the bore of the magnet.

In accordance with another embodiment of the invention, an MR assembly is disclosed that includes an RF coil operable in at least one of a transmit mode and a receive mode, and configured to be located within a bore of a magnet. A transmitter is operably connected to the RF coil and wirelessly transmits MR signals acquired by the RF coil when operating in a receive mode. The MR assembly also includes a power supply that provides power to at least operate the transmitter and the RF coil. The power supply has at least one photovoltaic cell and a fiber optic cable to receive a beam of light from a light source external to the bore of the magnet and translate the beam of light to the power supply.

In accordance with a further embodiment of the present invention, an MR apparatus includes a first RF coil for transmitting an RF signal inside a magnet bore and a second RF coil placed adjacent to an imaging subject positioned inside the magnet bore. The second RF coil operates in a receive mode to receive MR signals from the imaging subject. A signal converter is included to convert MR signals into digital signals. The MR apparatus further includes a rechargeable power supply connected to the second RF coil and the signal converter that supplies power thereto and a pickup coil connected to the rechargeable power supply and to recharge the power supply with electrical energy generated from the RF signal.

The present invention has been described in terms of the preferred embodiment, and it is recognized that equivalents, alternatives, and modifications, aside from those expressly stated, are possible and within the scope of the appending claims.

What is claimed is:

1. An MR system comprising:
   an RF coil operable to transmit or receive RF signals and located within a bore of a magnet;
   a converter to convert RF signals to digital signals;
   a power supply arranged to provide power to at least operate the RF coil and converter, the power supply operable without use of a battery and without use of a wired connection external to the bore of the magnet; and
   wherein the converter comprises an analog-to-digital converter adapted to digitize MR signals received by the RF coil prior to transmission of the MR signals out of the bore and a frequency converter configured to downconvert a frequency of the MR signals to reduce a required bandwidth of the analog-to-digital converter.

2. The MR system of claim 1 wherein the power supply comprises:
a fiber optic cable;
a light source optically coupled to a first end of the fiber optic cable;
at least one photovoltaic cell optically coupled to a second end of the fiber optic cable and electrically connected to the RF coil and converter, the at least one photovoltaic cell constructed to generate electrical current when exposed to at least one of visible light, infrared radiation, and ultraviolet radiation.

3. The MR system of claim 1 further comprising:
a transmit coil configured to transmit RF signals into the bore of the magnet; and
wherein the power supply comprises:
an energy storage device connected to the RF coil and configured to at least operate the converter; and
a voltage rectifier connected to the energy storage device and configured to rectify a voltage induced in the RF coil by the transmit coil when the RF coil is operating in a receive mode and to recharge the energy storage device from the rectified voltage.

4. The MR system of claim 1 further comprising:
a transmit coil configured to transmit RF signals into the bore of the magnet; and
wherein the power supply comprises:
an energy storage device configured to at least operate the converter; and
a receive coil configured to receive RF signals transmitted by the transmit coil and to recharge the energy storage device from electrical energy derived from the RF signals.

5. The MR system of claim 1 further comprising:
a gradient coil configured to transmit gradient signals into the bore of the magnet; and
wherein the power supply comprises:
an energy storage device configured to at least operate the RF coil and converter;
a pickup coil configured to receive gradient signals transmitted by the gradient coil and to recharge the energy storage device from electrical energy derived from the gradient signals.

6. The MR system of claim 1 further comprising:
a signal processor configured to reconstruct an MR image;
a wireless receiver connected to the signal processor and configured to receive and transfer digital MR signals to the signal processor;
a first wireless transmitter configured to transmit the digital MR signals from within the bore to the wireless receiver; and
wherein the power supply is further arranged to provide power to the wireless transmitter.

7. The MR system of claim 6 further comprising a second wireless transmitter and a signal modulator connected to the signal processor, the signal modulator configured to modulate phase information of RF pulses into wireless signals for transmission by the second wireless transmitter to the converter.

8. The MR system of claim 6 further comprising:
a fiber optic cable optically coupled to the wireless transmitter and the wireless receiver; and
a signal converter connected to the wireless transmitter and configured to convert the phase information into optical signals for transmission via the fiber optic cable.

9. The MR system of claim 1 further comprising:
a wireless receiver operably connected to a frequency converter and configured to relay received signals to the frequency converter, wherein the wireless receiver and the frequency converter are located within the bore of the magnet;
a wireless transmitter configured to transmit phase information to the wireless receiver; and
wherein the power supply is further arranged to provide power to the wireless receiver and the frequency converter.

10. The MR system of claim 1 wherein the power supply comprises an ultracapacitor.

11. An MR assembly comprising:
an RF coil operable in at least one of a transmit mode and a receive mode, and configured to be located within a bore of a magnet;
a converter configured to digitize MR signals detected by the RF coil when operating in the receive mode;
a transmitter operably connected to the converter and configured to wirelessly transmit the digitized MR signals out of the bore;
a power supply connected to the RF coil and configured to provide power to at least operate the transmitter, the converter, and the RF coil, when the RF coil is operating in the receive mode, the power supply comprising:
at least one photovoltaic cell;
a light source; and
a fiber optic cable configured to receive a beam of light from a light source and translate the beam of light to the power supply.

12. The MR assembly of claim 11 further comprising:
a receiver positioned external to the bore of the magnet and configured to receive the digitized MR signals transmitted by the transmitter; and
a signal processor operably connected to the receiver and configured to reconstruct an MR image from the received MR signals.

13. The MR assembly of claim 11 wherein the converter includes an analog-to-digital converter configured to convert MR signals into digital signals and a frequency converter configured to convert the MR signals from a first frequency to a second frequency different from the first frequency.

14. The MR assembly of claim 11 further comprising:
a wireless receiver operably connected to the converter and configured to relay received signals to the converter;
a wireless transmitter configured to transmit phase information signals to the wireless receiver; and
wherein the power supply is further configured to provide power to operate the wireless receiver.

15. The MR assembly of claim 14 wherein the wireless transmitter is further configured to wirelessly transmit digitally converted MR signals via one of an RF signal medium and an optical signal medium.

16. An MR apparatus comprising:
a first RF coil for transmitting RF signals inside a magnet bore;
a second RF coil placed adjacent to an imaging subject positioned inside the magnet bore and configured to operate in a receive mode to receive MR signals from the imaging subject;
a gradient coil assembly positioned about the bore of the magnet to apply magnetic gradient pulses therein;
a signal converter to convert MR signals into digital signals;

a rechargeable power supply configured to supply power to the signal converter, the rechargeable power supply operable without use of a battery and without use of a wired connection external to the bore of the magnet; and a pickup coil connected to the rechargeable power supply and configured to recharge the power supply with electrical energy induced therein by magnetic gradient pulses applied by the gradient coil assembly.

17. The MR apparatus of claim 16 wherein the rechargeable power supply is further configured to supply a reference voltage to the second RF coil.

18. The MR apparatus of claim 16 wherein:
the gradient coil assembly comprises a gradient transmit coil for transmitting gradient signals inside the magnet bore; and
wherein the pickup coil is a gradient receive coil constructed to receive gradient signals transmitted by the gradient transmit coil.

19. The MR apparatus of claim 16 further comprising:
a transmitter operably connected to the signal converter and configured to wirelessly transmit digitally converted MR signals, the transmitter configured to receive power from the rechargeable power supply;
a receiver positioned outside the magnet bore and configured to wirelessly receive the digitally converted MR signals; and
a processor operably connected to the receiver and configured to convert the digitally converted MR signals into an MR image.

20. The MR apparatus of claim 16 further comprising a preamplifier and a frequency converter configured to receive power from the rechargeable power supply, the frequency converter configured to downconvert a frequency of the MR signals received by the second RF coil before the MR signals are converted to digital signals by the signal converter.

21. The MR apparatus of claim 16 further comprising:
a receiver operably connected to a frequency converter and configured to relay received signals to the frequency converter;
a transmitter configured to wirelessly transmit phase information signals to the receiver; and
wherein the rechargeable power supply is further configured to supply power to the receiver and to the frequency converter.

22. The MR apparatus of claim 21 wherein the frequency converter is configured to convert the MR signals acquired by the second RF coil having a first frequency into MR signals having a second frequency different from the first frequency.

23. The MR apparatus of claim 16 further comprising a plurality of diodes connected to the pickup coil and configured to rectify the electrical energy induced therein.

24. The MR apparatus of claim 23 wherein the rechargeable power supply comprises a capacitor configured to receive charging current from the plurality of diodes.

25. The MR apparatus of claim 16 wherein the power supply comprises an ultracapacitor.

26. An MR system comprising:
an RF coil operable to transmit or receive RF signals and located within a bore of a magnet;
a converter to convert RF signals to digital signals;
a power supply arranged to provide power to at least operate the RF coil and converter, the power supply operable without use of a battery and without use of a wired connection external to the bore of the magnet;
a signal processor configured to reconstruct an MR image;
a wireless receiver connected to the signal processor and configured to receive and transfer digital MR signals to the signal processor;
a first wireless transmitter configured to transmit the digital MR signals from within the bore to the wireless receiver; and
wherein the power supply is further arranged to provide power to the wireless transmitter.

27. The MR system of claim 26 further comprising a second wireless transmitter and a signal modulator connected to the signal processor, the signal modulator configured to modulate phase information of RF pulses into wireless signals for transmission by the second wireless transmitter to the converter.

28. The MR system of claim 26 further comprising:
a fiber optic cable optically coupled to the wireless transmitter and the wireless receiver; and
a signal converter connected to the wireless transmitter and configured to convert the phase information into optical signals for transmission via the fiber optic cable.

* * * * *